United States Patent [19]

Sullivan et al.

[11] Patent Number: 4,712,388

[45] Date of Patent: Dec. 15, 1987

[54] CRYOSTAT COOLING SYSTEM

[75] Inventors: Daniel C. Sullivan, Columbia Heights; Earl A. Mazorol, Jr., Bloomington, both of Minn.

[73] Assignee: ETA Systems, Inc., St. Paul, Minn.

[21] Appl. No.: 1,236

[22] Filed: Jan. 7, 1987

[51] Int. Cl.[4] ............................................. F25B 19/00
[52] U.S. Cl. ............................ 62/514 R; 174/15 CA
[58] Field of Search ................. 62/514 R; 174/15 CA

[56] References Cited

U.S. PATENT DOCUMENTS

| | | | |
|---|---|---|---|
| 3,122,004 | 2/1964 | Aberle et al. | 62/259 |
| 3,133,144 | 5/1964 | Cottingham et al. | 174/15 |
| 3,615,934 | 10/1971 | Bower | 148/186 |
| 3,905,508 | 9/1975 | Hibl et al. | 220/15 |
| 4,207,827 | 6/1980 | Gondouin | 114/74 |
| 4,279,127 | 7/1981 | Lonesworth | 62/514 R |
| 4,291,541 | 9/1981 | Kneip, Jr. et al. | 62/514 R |
| 4,462,214 | 7/1984 | Ito | 62/514 R |
| 4,502,296 | 3/1985 | Ogata et al. | 62/514 R |

OTHER PUBLICATIONS

"The Cray-2 Computer System", MP-0201, Cray Research, Inc. 1985.
IBM Technical Disclosure Bulletin, vol. 18, No. 4, 9/1975, entitled Close-Cycle Liquid Nitrogen Refrigeration System for Low-Temperature Computer Operation.

Primary Examiner—Ronald C. Capossela
Attorney, Agent, or Firm—Kinney & Lange

[57] ABSTRACT

A cryostat cooling system cools the central processor (CP) circuit boards of a computer to enhance the performance of the electronic components of the central processor. The cryostat includes a pair of concentrically positioned circular cylindrical shells. The inner shell is suspended from the outer shell by a thin (small cross-section) thermal isolation support ring. A vacuum chamber is formed between the inner and the outer shells. The top of the inner shell is covered by an inner shell top plate having a pair of openings through which the CP boards are inserted. A pair of containment vessels are mounted below the inner shell top plate to receive the CP boards. An inlet supply tube is connected to the containment vessel to supply liquid nitrogen. Overflow vents permit excess liquid nitrogen and nitrogen gas to flow from the containment vessels into the interior of the inner shell. A drain tube is connected to the inner shell to remove and recirculate the gaseous and liquid nitrogen from the interior of the inner shell. Each CP board is connected to an associated central processor memory board by a connector block which seals the opening while permitting the flow of signals between the central processor memory and the central processor.

27 Claims, 12 Drawing Figures

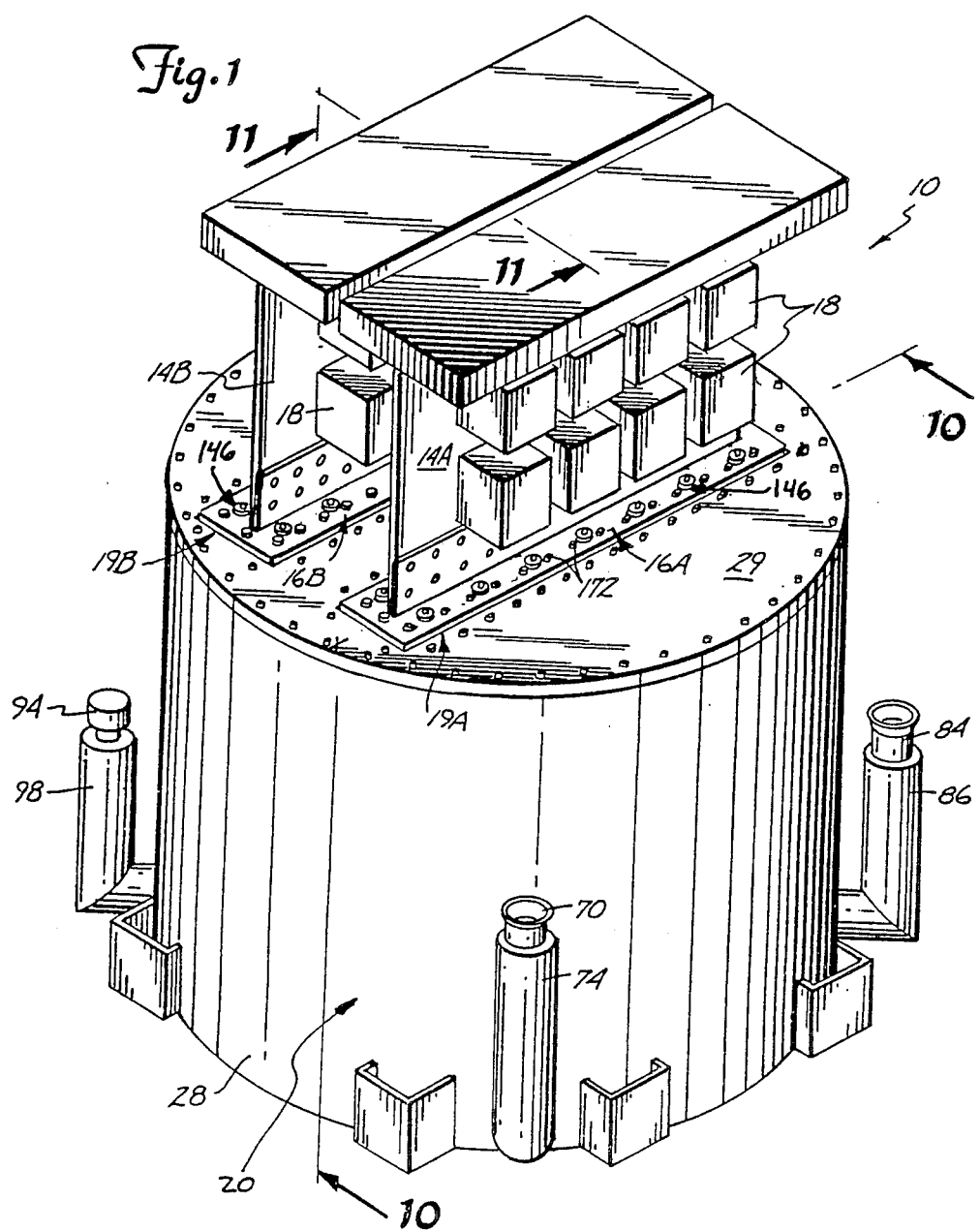

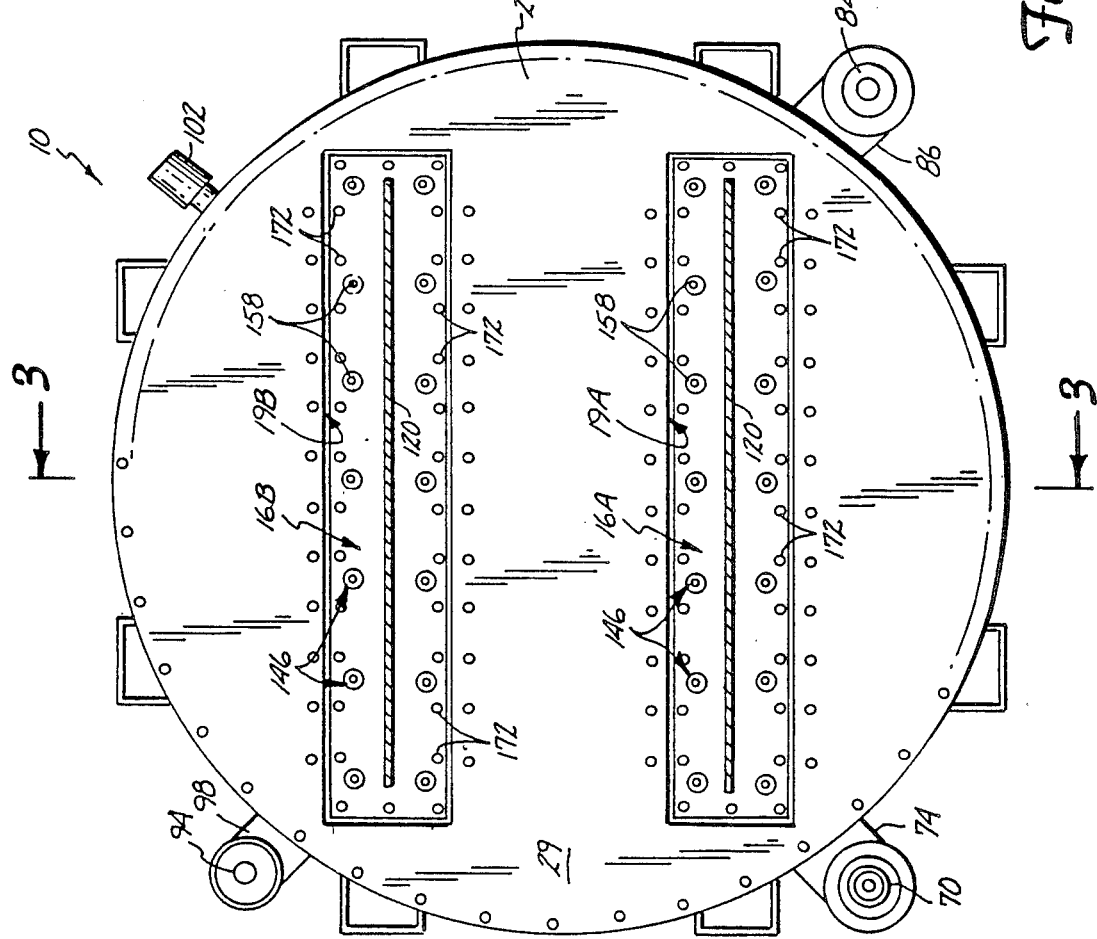

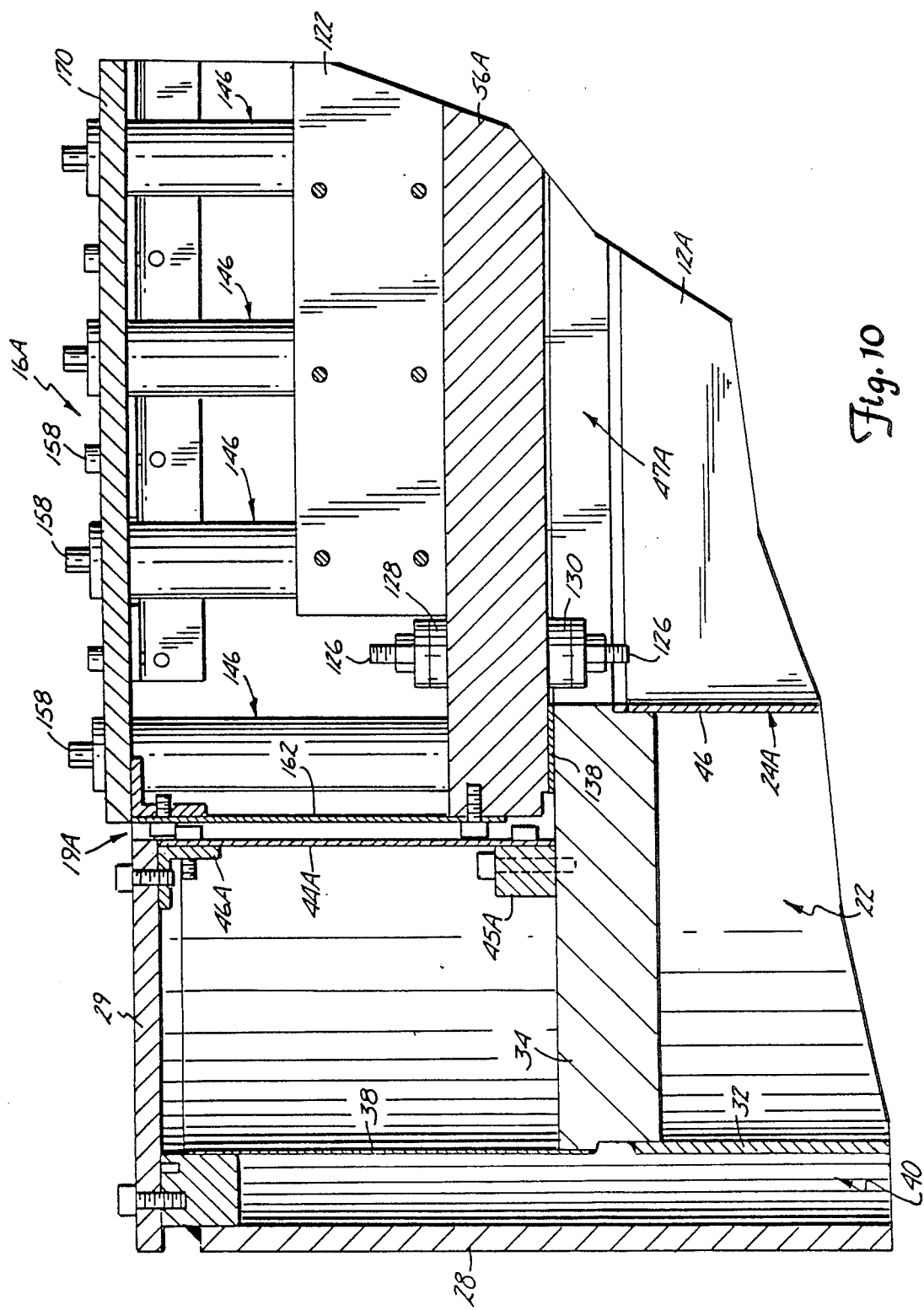

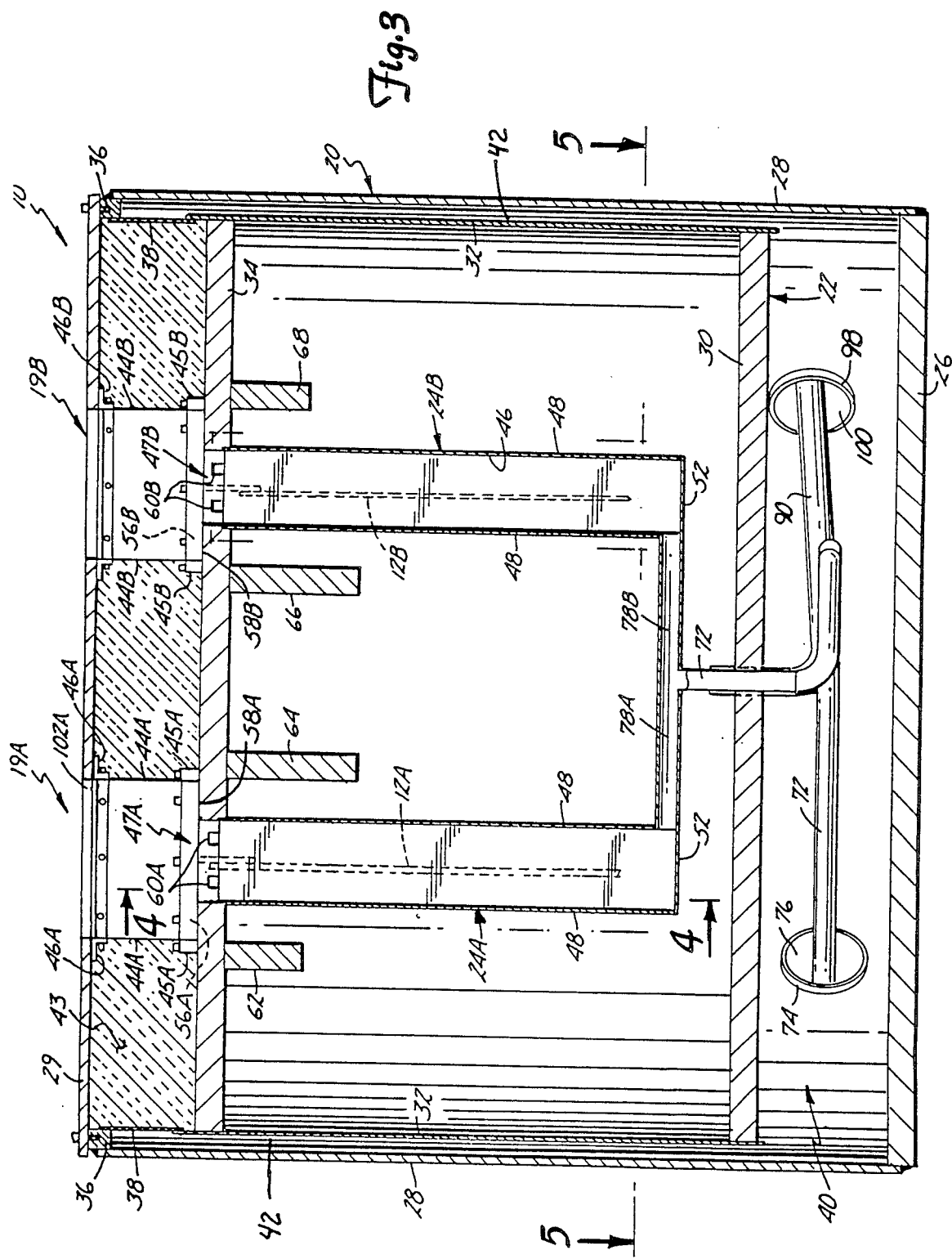

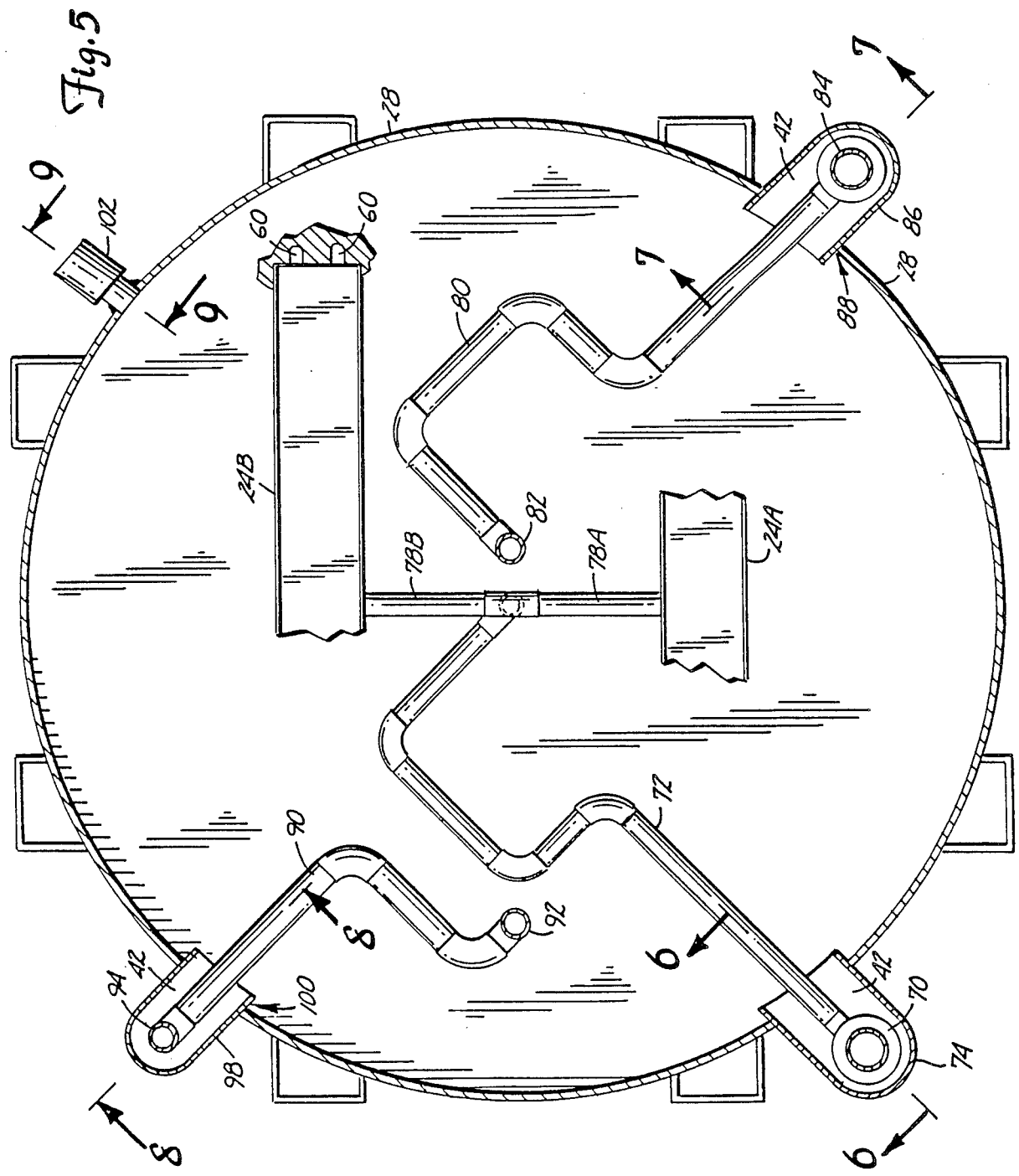

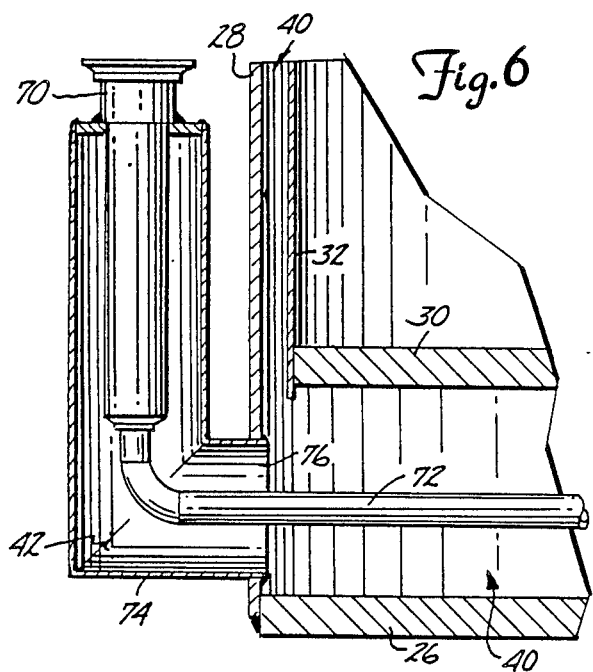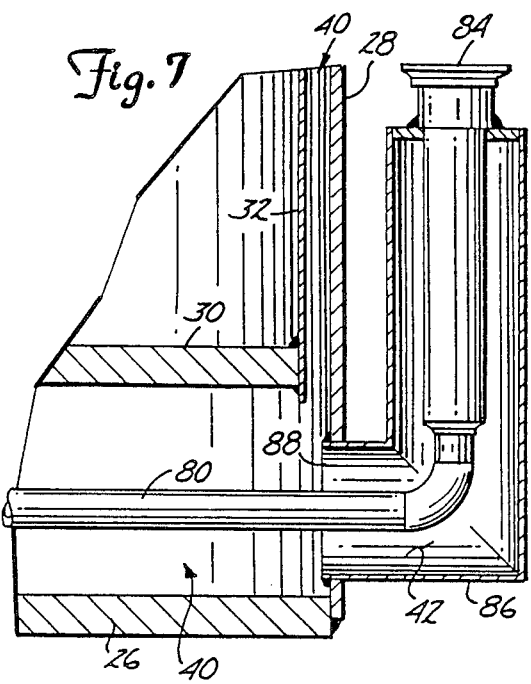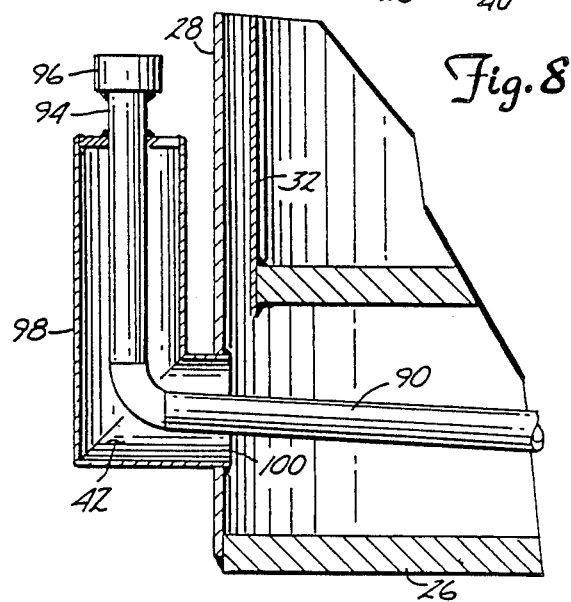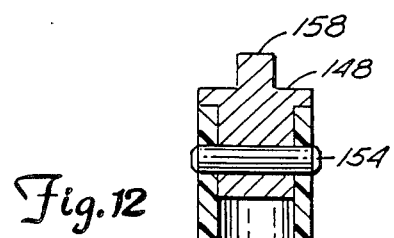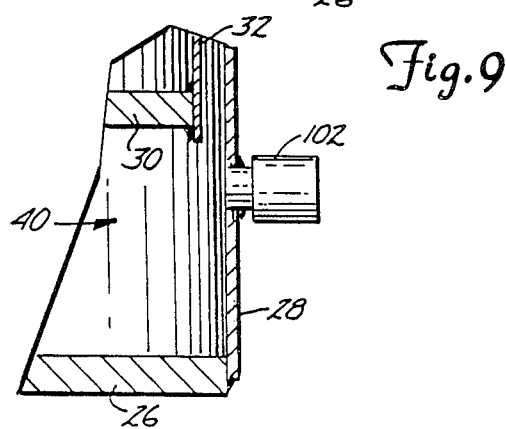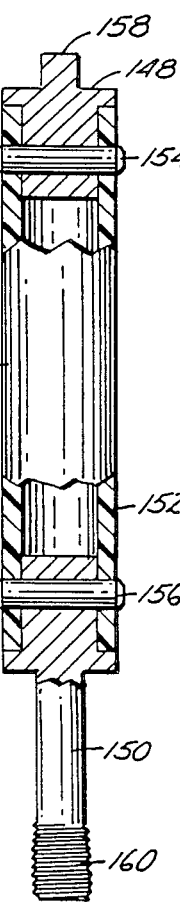

CRYOSTAT COOLING SYSTEM

BACKGROUND OF THE INVENTION

1. Field of the Invention:

The present invention relates to cryostats. In particular, the present invention is a cryostat for cooling the central processor of a computer system.

2. Description of the Prior Art:

The performance of certain electrical or electronic devices can be altered, and in fact enhanced, by operation at cryogenic temperature. Cryostats have been developed to permit operation of such devices at the extremely low temperature which is required. Examples of prior art of cryostats are illustrated in U.S. Pat. No. 3,122,004 by Aberle et al, U.S. Pat. No. 3,133,144 by Cottingham et al, and U.S. Pat. No. 4,502,296 by Ogata et al. In general, these devices use a Dewar type construction, with an inner and an outer vessel which are connected together to define a vacuum chamber. The inner vessel contains the cryogenic coolant (for example, liquid nitrogen or liquid helium) used to cool the particular electrical or electronic device. The vacuum maintained between the inner and outer vessels provides thermal insulation between the cryogenic coolant within the inner chamber and the ambient room temperature outside of the outer chamber.

As the computing power of computers has been increased, the demand for increasingly higher operating speeds of the integrated circuits of the computer's central processor has presented a significant technical challenge. One approach for achieving higher speeds is to use a semiconductor material (such as gallium arsenide) which is capable of yielding higher operating speed devices than is silicon. The disadvantage of this approach, however, is that the material growth and integrated circuit fabrication techniques are far more advanced in silicon than in any other semiconductor material.

SUMMARY OF THE INVENTION

An alternative approach which offers significant increases in speed while making use of silicon integrated circuits involves the use of very large scale CMOS gate arrays which are operated at cryogenic temperatures. By operating the CMOS devices at liquid nitrogen temperature (77°K.) rather than room temperature, approximately a two-to-one gain in operating speed of the circuits can be achieved.

In order to obtain the full advantage of this speed increase, the entire central processor (CP) circuitry must be operated at the cryogenic temperature. On the other hand, other circuits with which the central processor interacts (such as the central processor memory (CPM)) do not require cooling to cryogenic temperatures. It is important to minimize the number of components to be cooled to cryogenic temperature because each watt of energy removed in the cooling process requires a significant expenditure of energy (and thus cost). Typically ten watts of power are expended for each watt of energy removed by cryogenic cooling.

The cooling of a central processor, therefore, presents significant technical challenges. Among them is the need to provide high speed signal transmission between the central processor board and its associated central processor memory requires that the transmission paths between the CP and the CPM circuit boards be very short. This, however, conflicts with the need to maintain as much thermal isolation as possible between the interior vessel containing liquid nitrogen and the surrounding environment which is at room temperature.

The present invention is a cryostat for maintaining circuit boards at cryogenic temperatures. The cryostat includes inner and outer shells which are generally concentrically arranged and are connected together to define a vacuum chamber between the inner and outer shell. A vacuum is maintained within the vacuum chamber to provide thermal isolation between the ambient temperature outside of the outer shell, and the cryogenic temperatures maintained within the inner shell.

A top plate covers an open top end of the inner shell and has an opening through which a circuit board is inserted. Mounted below the top plate is a containment vessel which receives the circuit board and which holds the liquid cryogenic coolant. An inlet supply tube is connected to the containment vessel for supplying the liquid cryogenic coolant. An overflow vent provides a passage for coolant and gas to escape from the containment vessel to the interior of the inner shell. A drain tube is connected to the inner shell to remove coolant from within the interior of the inner shell. The top end of the containment vessel is sealed by a cover which covers the top opening and suspends the circuit board in the containment chamber. Connector means extend through the cover to permit transmission of signals to and from the circuit board.

In preferred embodiments of the present invention, the inner and outer shells are concentriclaly arranged cylinders of circular cross section. The containment vessel is of generally rectangular cross section, so as to minimize the volume of coolant surrounding the circuit board. This reduces significantly the amount of coolant required to cool the system down to the cryogenic operating temperature, and also significantly reduces the amount of coolant which must be disposed of when the cryostat must be returned to room temperature (for example, in order to remove and replace a circuit board).

BRIEF DESCRIPTION OF THE DRAWINGS

FIG. 1 is a perspective view of the cryostat of the present invention with central processor boards mounted within the cryostat.

FIG. 2 is a top view of the cryostat of FIG. 1, with the central processor memory boards removed.

FIG. 3 is a view along section 3—3 of FIG. 2.

FIG. 5 is a view along section 5—5 of FIG. 3.

FIG. 6 is a view along section 6—6 of FIG. 5.

FIG. 7 is a view along section 7—7 of FIG. 5.

FIG. 8 is a view along section 8—8 of FIG. 5.

FIG. 9 is a view along section 9—9 of FIG. 5.

FIG. 10 is a view along section 10—10 of FIG. 1.

FIG. 12 shows a hold down bolt used in clamping the cover to the inner shell top plate of the cryostat.

DETAILED DESCRIPTION OF THE PREFERRED EMBODIMENTS

Figure 11:
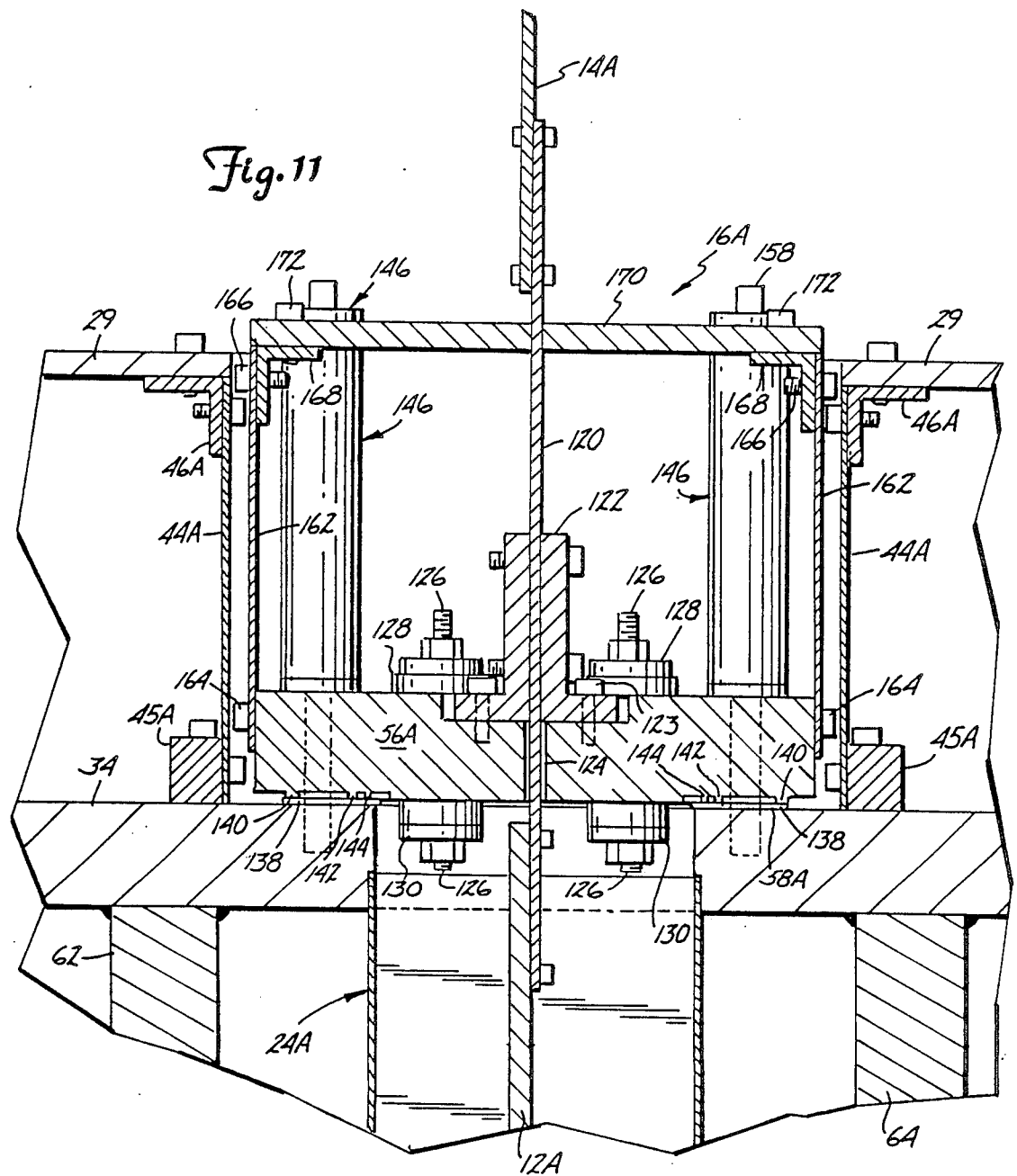
FIG. 11 is a view along section 11—11 of FIG. 1.

Cryostat 10, which is shown in perspective in FIG. 1, cools central processor (CP) circuit boards 12A and 12B (shown in phantom in FIG. 3) to cryogenic temperatures (for example 77°K.). CP circuit boards 12A and 12B are connected to central processor memory (CPM) boards 14A and 14B, respectively, through seal boards 120 (shown in FIGS. 2 and 22. Each CPM board 14A and 14B has a plurality of central processor memory modules 18 mounted on it. Each central processor memory module 18 contains a stack of circuit boards carrying integrated circuit computer memory chips. Seal block assemblies 16A and 16B are positioned within cavities 19A and 19B, respectively, at the top end of cryostat 10.

As best shown in FIG. 3, cryostat 10 has a cylindrical outer shell 20, a cylindrical inner shell 22 and a pair of CP containment vessels 24A and 24B. Outer shell 20 is formed by base plate 26, cylindrical outer side wall 28, and outer shell top plate 29. Inner shell 22 is formed by bottom plate 30, cylindrical inner side wall 32 and inner shell top plate 34. Outer shell 20 and inner shell 22 are joined together in a concentric arrangement by mounting ring 36 and thermal isolation support ring 38. Together, inner and outer shells 20 and 22 define vacuum chamber 40, which provides thermal isolation between the interior of inner shell 22 (which is at liquid nitrogen temperature 77°K. during operation) and the environment surrounding outer shell 20 (which is typically at about room temperature). Super insulation 42 is formed on the outer surface of inner side wall 32 to cut down on radiation losses. Super insulation 42 is formed by alternating layers of reflective and insulating material, and performs optimally in vacuum environments.

Thermal conduction between inner shell 22 and outer shell 20 is minimized by thermal isolation ring 38 and insulating foam 43. Inner shell 22 is suspended from mounting ring 36, and thus from outer shell 20 by thermal isolation ring 38. In one preferred embodiment of the present invention, thermal isolation ring 38 is thin (0.020 inch) stainless steel, which is a relatively poor conductor of heat, yet provides sufficient structural strength to suspend inner shell 22 within outer shell 20. Insulating foam 43 fills the space between top plates 29 and 34 and between thermal isolation ring 38 and walls 44a and 44B (which define cavities 19A and 19B, respectively). Because physical contact between outer shell 20 and inner shell 22 is through thermal isolation ring 38 and insulating foam 43, the conductive heat transfer between top plate 34 of inner shell 20 and top plate 29 of outer shell 22 is minimized.

Side walls 44A (which define cavity 19A in which seal block assembly 16A is positioned) are attached at their lower ends to mounting bars 45A on inner shell top plate 34. Similarly, side walls 44B (which define cavity 19B) are attached at their lower ends to mounting bars 45B on inner shell top plate 34.

The upper ends of walls 44A and 44B are connected to brackets 46A and 46B, respectively, which in turn are attached to the bottom surface of outer shell top plate 29. Walls 44A and 44B, are a low thermal conductivity material, such as G10 epoxy, to minimize conductive heat transfer.

Figure 4:
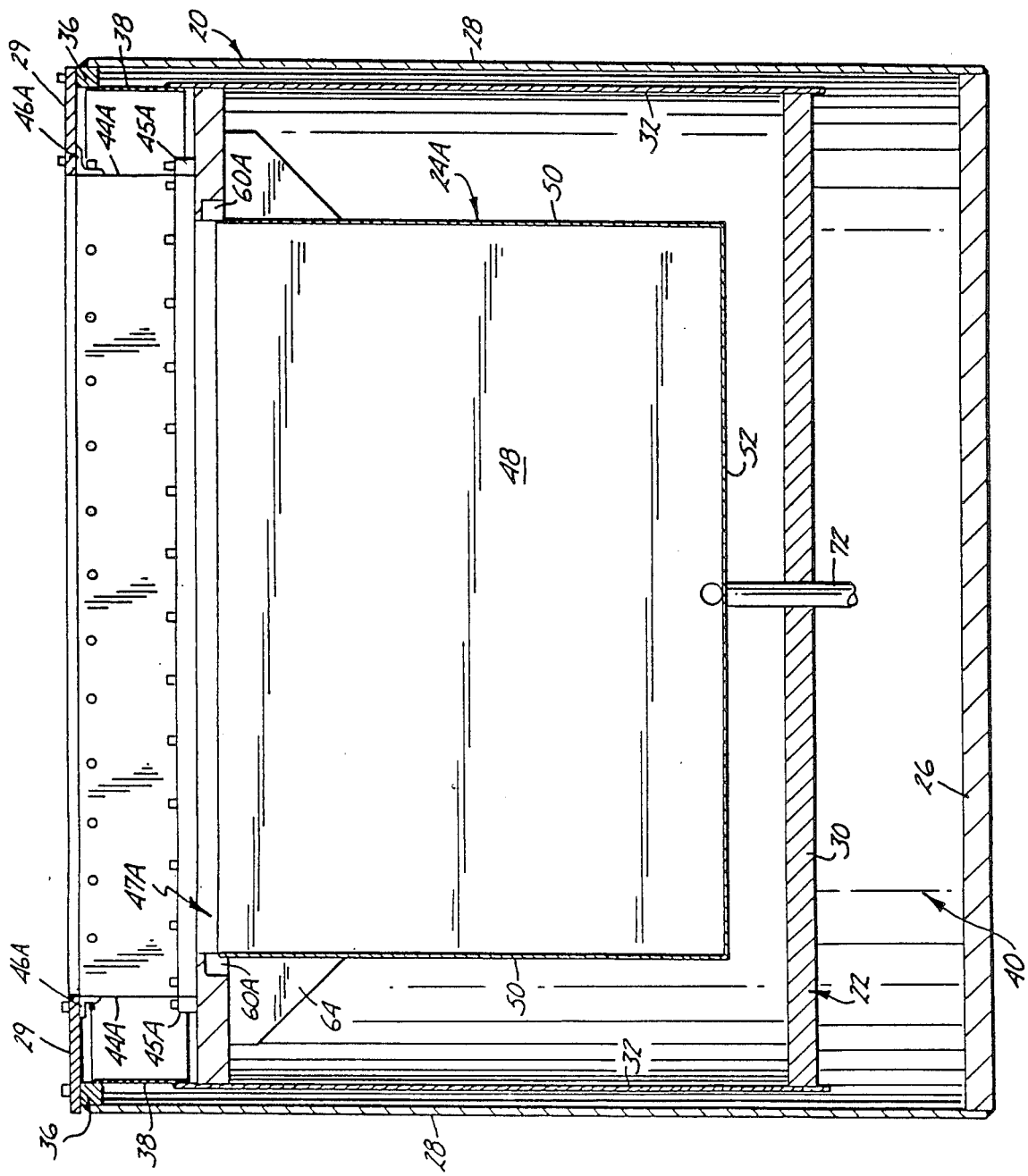
FIG. 4 is a view along section 4—4 of FIG. 3.

Inner shell top plate 34 has a pair of rectangular openings 47A and 47B which are located at the bottom of cavities 19A and 19B, respectively. Containment vessels 24A and 24B are mounted within inner shell 22 below openings 47A and 47B, respectively. Each containment vessel 24A and 24B has a pair of side walls 48, a pair of end walls 50 (FIG. 4), and a bottom plate 52.

When CP board 12A, 12B is installed within containment vessel 24A, 24B, cover plates 56A, 56B of seal block assemblies 16A, 16B seal against machined flat surface seal areas 58A, 58B (FIG. 3) which surround opening 47A, 47B, respectively. Overflow vents 60A, 60B in inner shell top plate 34 provide a path for escape of liquid nitrogen and nitrogen gas from the interior of containment vessels 24A, 24B, respectively, to the interior of inner shell 22. Covers 56A, 56B prevent the escape of liquid nitrogen or nitrogen gas through the top ends of opening 47A, 47B.

Stiffeners 62, 64, 66, and 68 are mounted on the bottom surface of inner shell top plate 34, with stiffeners 62 and 64 positioned on opposite sides of containment vessel 24A and stiffeners 66 and 68 positioned on opposite sides of containment vessel 24B. Stiffeners 62, 64, 66 and 68 prevent deflection of top plate 34 so that seal areas 58A and 58B remain flat, and reliable seals can be made between covers 56A and 56B and inner shell top plate 34.

Liquid nitrogen from a liquid nitrogen source (not shown) is received at inlet coupling 70 and is supplied through supply tube 72 to the bottom ends of containment vessels 24A and 24B. As best shown in FIGS. 5 and 6, inlet coupling 70 is a female bayonet coupling, which is clamped by a Marmand clamp (not shown) when connection is made to the liquid nitrogen source. Pants leg 74 is sealed around inlet coupling 70 and is connected to side wall 28. Supply tube 72 connects to the lower end of inlet coupling 70 within pants leg 74 and extends through opening 76 in side wall 28. Supply tube 72 enters the interior of inner shell 22 through bottom plate 30 and forms a "T", with leg 78A being connected to containment vessel 24A and leg 78B being connected to containment vessel 24B.

Return line 80 has its inlet end 82 open to the interior of inner shell 22 and its outlet end connected to outlet coupling 84. Return line 80 receives nitrogen gas and liquid which has been received in the interior of inner shell 22 after it has escaped from one of the containment vessels 24A, 24B through overflow vents 60A, 60B. The gas and liquid flows out through return line 80 to outlet coupling 84, and then back to the liquid nitrogen source. Pants leg 86 surrounds and is sealed to outlet coupling 84, and is connected to outer side wall 28 at opening 88.

Pressure relief line 90 (shown in FIGS. 5 and 8) also communicates with the interior of inner shell 22. Inlet end 92 of pressure relief line 90 extends through bottom plate 30 and into the interior of inner shell 22, while the outlet end 94 of line 90 is connected to coupling 96. A pressure relief valve (not shown) is connected to coupling 96. Pants leg 98 surrounds and is sealed to outlet end 94 of pressure relief line 90 and is connected to outer side wall 28 at opening 100.

In preferred embodiments of the present invention, bulk insulation such as glass wool is applied to the inner surfaces of pants legs 74, 86 and 98.

Also mounted on outer wall 28 is vacuum seal off valve 102 (see FIGS. 5 and 9). The vacuum chamber 40 is initially evacuated through valve 102.

Each seal block assembly 16A and 16B is located within a cavity 19A, 19B defined by inner shell top plate 34, outer shell top plate 29 and walls 44A, 44B. Seal block assemblies 16A and 16B must perform several important functions. First, they must provide a seal at the upper end of containment vessels 24A and 24B. Second, they must provide thermal isolation between the interiors of containment vessel 24A and 24B (which are at liquid nitrogen temperature) and CPM back planes 14A and 14B (which are at or very near room temperature. Third, they must provide feed-throughs for electrical power to CP boards 12A and 12B. Fourth, they must be removable in order to permit removal, replacement or repair of CP boards 12A and 12B.

FIGS. 10 and 11 show seal block assembly 16A in further detail, and it will be understood that seal block assembly 16B is similar in construction. Electrical connection between CP board 12A and CPM back plane 14A is provided by seal board 120. The upper end of CP board 12A is attached to the lower end of seal board 120, and the lower end of CPM back panel 14A is attached to the upper end of seal board 120. Feed-through clamp 122 holds seal board 120 in position, and is clamped by bolts 123 to cover 56A. Seal board 120 extends through opening 124 in cover 56A. Power bus terminals 126 extend through cover 56A to provide a feed-through connection of power to CP board 12A. Insulator blocks 128 and 130 provide electrical insulation of terminals 126 from cover 56A.

Teflon gasket 138 surrounds opening 47A and is positioned between seal area 58A and cover 56A. In the embodiment shown in FIG. 11, cover 56A includes a plurality of pressure point ridges 140, 142, and 144 which apply pressure to gasket 138.

Cover 56A is clamped down against top plate 34 by bolts 146. FIG. 12 shows a preferred embodiment of one of the bolts 146. In this embodiment, bolt 146 has a metal upper end 148, a metal lower end 150, and a thermally insulating plastic sleeve 152. Pin 154 joins sleeve 152 to metal upper end 148, and pin 156 joins sleeve 152 to lower metal end 150. Upper end 148 has a hex head 158 which is used for tightening and removing bolt 146. The lower end 150 has a threaded shank 160 which extends into a threaded hold in top plate 34. Bolt 146 provides high clamping forces while avoiding a high thermal conductivity path from inner shell top plate 34 to the exterior of cryostat 10.

Seal block assembly 16A has side walls 162 which are attached at their lower ends by screws 164 to cover 56A. At their upper ends, walls 162 are attached by screws 166 to brackets 168. Top panel 170 of seal block assembly 16A is connected to brackets 168 by screws 172.

The cryostat of the present invention has a number of important advantages. First, the cylindrical construction of the outer and inner shells 20 and 22 provides an easily fabricated construction for the vacuum chamber. Because of the cylindrical configuration, relatively light weight metals can be used for the side walls of shells 20 and 22.

Second, the use of rectangular shaped containment vessels 24A and 24B within inner shell 22 provides a minimum volume for the liquid nitrogen because the rectangular configuration conforms to the shape of the central processor circuit boards 12A and 12B. This reduces the amount of liquid nitrogen which must be used (in contrast to having to fill the entire volume of inner shell 22).

Third, inner shell 22 shields the containment vessels 24A and 24B from outer shell 20, and therefore the entire mass of the cryostat 10 does not have to be cooled down and warmed up each time a CP board 12A, 12B is removed for replacement or maintenance.

Fourth, because the interior of the containment vessels 24A, 24B is at the same pressure as the exterior (i.e. the interior of inner shell 22) the walls of containment vessels 24A and 24B can be of relatively light weight construction. This light weight construction also contributes to faster heat up and cool down of the containment vessels 24 and 24B.

Fifth, cryostat 10 provides relatively short signal paths between CP boards 12A, 12B and the corresponding CPM boards 14A, 14B, so that high operating speeds can be achieved. At the same time, a large temperature differential with minimum thermal losses is maintained between CP boards 12A, 12B and CPM back plane boards 14A, 14B.

Although the present invention has been described with reference to preferred embodiments, workers skilled in the art will recognize that changes may be made in form and detail without departing from the spirit and scope of the invention.

What is claimed is:

1. A cryostat comprising:
   an outer shell having a side wall and a closed bottom;
   an inner shell positioned within the outer shell, the inner shell having a side wall, a closed botton and an open top;
   means for connecting the inner and outer shells to define a vacuum chamber therebetween;
   an inner shell top plate covering the open top end of the inner shell, the inner shell top plate having a first opening therein;
   a first containment vessel mounted below the inner shell top plate and within an interior of the inner shell for receiving a first device to be cooled;
   supply means connected to the first containment vessel for supplying liquid cryogenic coolant to the first containment vessel; and
   means for suspending the device in the first containment vessel while covering the first opening and while providing transmission of signals to and from the first device.

2. The cryostat of claim 1 wherein the outer shell and the inner shell are cylinders are of generally circular cross-section.

3. The cryostat of claim 2 wherein the outer shell and inner shell are essentially concentrically positioned with the inner shell inside of the outer shell.

4. The cryostat of claim 3 wherein the containment vessel is of generally rectangular cross-section.

5. The cryostat of claim 4 wherein the device to be cooled is a circuit board having first and second generally parallel major surfaces, and wherein the first containment vessel has first and second side walls which are generally parallel to the first and second major surfaces of the circuit board.

6. The cryostat of claim 1 wherein the means for connecting is a thermal isolation ring which extends between the outer shell and the inner shell.

7. The cryostat of claim 6 wherein the thermal isolation ring is connected at its upper end to the outer shell and is connected at its lower end to the inner shell.

8. The cryostat of claim 1 and further comprising:
   an outer shell top plate mounted on the outer shell and covering a top end of the outer shell, the outer shell top plate having a first opening positioned over the first opening in the inner shell top plate.

9. The cryostat of claim 8 and further comprising:
   means for defining a cavity between the first opening of the outer shell top plate and the first opening of the inner shell top plate for receiving the means for suspending the device.

10. The cryostat of claim 9 and further comprising:
    thermal insulation means positioned between the outer shell top plate and the inner shell top plate and generally surrounding the cavity.

11. The cryostat of claim 1 wherein the means for suspending comprises:
a cover;
means extending through the cover for providing transmission of signals to and from the device; and
means for attaching the cover to the inner shell top plate to cover the first opening.

12. The cryostat of claim 11 wherein the means for mounting comprises a plurality of bolts, each bolt having an upper end with a head, a lower end with a threaded shank and a thermally insulating sleeve connecting the upper end and the lower end.

13. The cryostat of claim 11 wherein the device to be cooled is a circuit board, and wherein the means for providing transmission of signals is a seal board which extends through and is sealed to the cover, and is connected at its lower end to an upper end of the circuit board.

14. The cryostat of claim 1 wherein the supply means comprises:
an inlet coupling exposed at an exterior of cryostat; and
means extending from the inlet coupling through the inner shell to the first containment vessel.

15. The cryostat of claim 14 and further comprising:
a pant leg surrounding and sealed to the inlet coupling at a first end and connected at a second end to the side wall of the outer shell.

16. The cryostat of claim 1 and further comprising:
overflow vent means for providing a passage for the coolant from the first containment vessel to the interior of the inner shell; and
drain means connected to the inner shell to remove coolant from within the interior of the inner chamber.

17. The cryostat of claim 1 and further comprising:
a second opening in the inner shell top plate generally parallel to the first opening;
a second containment vessel mounted below the inner shell top plate and within the interior of the inner shell for receiving a second device to be cooled;
wherein the supply means is connected to the second containment vessel for supplying liquid cryogenic coolant to the second containment vessel; and
second mounting means for suspending the second device to be cooled in the second containment chamber while covering the second opening and while providing transmission of signals to and from the second device.

18. A cryogencially cooled computer system comprising:
a central processor circuit board having a plurality of integrated circuits mounted thereon which form a computer central processor;
a central processor memory having a plurality of memory elements which are associated with the central processor;
a cryostat having a containment vessel for receiving the central processor circuit board and having inlet supply means for supplying liquid cryogenic collant to the containment vessel to cool the central processor circuit board to a cryogenic temperature; and
mounting means connected to the central processor circuit board and the central processor memory for suspending the central processor circuit board within the containment vessel, the mounting means including means for sealing the containment vessel from the exterior of the cryostat, means for providing transmission of signals between the central processor circuit board and the central processor memory, and power feed-through means for providing electrical power to the central processor circuit board.

19. The invention of claim 18 wherein the cryostat includes:
an outer shell;
an inner shell positioned within the outer shell;
means for connecting the inner and outer shells to define a vacuum chamber therebetween; and
wherein the containment vessel is mounted within an interior of the inner shell.

20. The invention of claim 19 and further comprising:
supply means connected to the containment vessel for supplying liquid cryogenic coolant to the containment vessel.

21. The invention of claim 20 and further comprising:
overlow vent means for providing a passage for the coolant from the containment vessel to the interior of the inner shell.

22. The invention of claim 20 and further comprising:
drain means connected to the inner shell to remove coolant from within the interior of the inner chamber.

23. The invention of claim 19 wherein the outer shell and the inner shell are cylinders of generally circular cross-section.

24. The invention of claim 23 wherein the outer shell and inner shell are essentially concentrically positioned with the inner shell inside of the outer shell.

25. The invention of claim 24 wherein the containment vessel is of generally rectangular cross-section.

26. The invention of claim 19 wherein the means for connecting is a thermal isolation ring which is connected at its upper end to the outer shell and is connected at its lower end to the inner shell.

27. The invention of claim 18 wherein the integrated circuits, mounted on the central processor circuit board are CMOS integrated circuits.

* * * * *